(12) United States Patent
Earhart

(10) Patent No.: US 10,754,587 B2
(45) Date of Patent: Aug. 25, 2020

(54) MEMORY PARTITIONING STORAGE CONTROLLER

(71) Applicant: Burlywood, LLC, Longmont, CO (US)

(72) Inventor: Tod R. Earhart, Longmont, CO (US)

(73) Assignee: Burlywood, Inc., Longmont, CO (US)

( * ) Notice: Subject to any disclaimer, the term of this patent is extended or adjusted under 35 U.S.C. 154(b) by 173 days.

(21) Appl. No.: 15/075,184

(22) Filed: Mar. 20, 2016

(65) Prior Publication Data

US 2016/0274800 A1  Sep. 22, 2016

Related U.S. Application Data

(60) Provisional application No. 62/136,336, filed on Mar. 20, 2015.

(51) Int. Cl.
  *G06F 3/06* (2006.01)
  *G06F 11/10* (2006.01)
  *G06F 12/08* (2016.01)
  *G11C 29/52* (2006.01)

(52) U.S. Cl.
  CPC .......... *G06F 3/0661* (2013.01); *G06F 3/064* (2013.01); *G06F 3/068* (2013.01); *G06F 3/0608* (2013.01); *G06F 3/0613* (2013.01); *G06F 3/0626* (2013.01); *G06F 3/0644* (2013.01); *G06F 3/0658* (2013.01); *G06F 3/0659* (2013.01); *G06F 3/0664* (2013.01); *G06F 3/0679* (2013.01); *G06F 11/1048* (2013.01); *G06F 11/1068* (2013.01); *G06F 12/08* (2013.01); *G06F 2212/1044* (2013.01); *G06F 2212/151* (2013.01); *G06F 2212/214* (2013.01); *G06F 2212/261* (2013.01); *G06F 2212/7208* (2013.01); *G11C 29/52* (2013.01)

(58) Field of Classification Search
None
See application file for complete search history.

(56) References Cited

U.S. PATENT DOCUMENTS

| 5,263,032 | A | 11/1993 | Porter et al. |
| 5,778,418 | A * | 7/1998 | Auclair .................. G06F 3/0625 711/101 |
| 6,052,797 | A | 4/2000 | Ofek et al. |
| 6,202,124 | B1 | 3/2001 | Kern et al. |
| 6,915,379 | B2 | 7/2005 | Honda et al. |
| 7,424,582 | B2 | 9/2008 | Takayama et al. |
| 7,908,408 | B2 | 3/2011 | Kono |
| 8,433,977 | B1 | 4/2013 | Vasquez et al. |

(Continued)

*Primary Examiner* — Charles J Choi

(57) ABSTRACT

A method of operating a storage controller is provided. The method includes receiving a request from a partition creator, for a first partition within a storage system, the first partition comprising one or more sequentially numbered data blocks, and receiving first partition parameters from the partition creator, the first partition parameters comprising a size of the one or more sequentially numbered data blocks. The method also includes creating the first partition within the storage system, through a storage interface, based on the first partition parameters, receiving first host data from a host, configuring the first host data as first storage data for storage within the first partition within the storage system, and sequentially storing the first storage data in the one or more sequentially numbered data blocks in the first partition, through the storage interface.

22 Claims, 12 Drawing Sheets

(56) References Cited

U.S. PATENT DOCUMENTS

| | | |
|---|---|---|
| 8,656,074 B2 | 2/2014 | Lai et al. |
| 8,930,599 B2 | 1/2015 | Lai et al. |
| 8,972,824 B1 | 3/2015 | Northcott et al. |
| 2005/0091425 A1 | 4/2005 | Wyatt et al. |
| 2006/0085670 A1 | 4/2006 | Carver et al. |
| 2006/0126394 A1 | 6/2006 | Li |
| 2006/0206680 A1 | 9/2006 | Yamanaka et al. |
| 2007/0283093 A1 | 12/2007 | Zohar et al. |
| 2008/0008001 A1 | 1/2008 | Kuroyanagi |
| 2008/0137415 A1 | 6/2008 | Lee |
| 2008/0162826 A1 | 7/2008 | Okamoto et al. |
| 2008/0235465 A1* | 9/2008 | So ............ G06F 3/061 711/154 |
| 2008/0306723 A1* | 12/2008 | De Ambroggi ..... G11C 11/005 703/21 |
| 2009/0172499 A1 | 7/2009 | Olbrich et al. |
| 2009/0235044 A1* | 9/2009 | Kisel ............ G06F 3/0613 711/173 |
| 2009/0276586 A1 | 11/2009 | Royer et al. |
| 2011/0029726 A1 | 2/2011 | Fujimoto |
| 2011/0096603 A1 | 4/2011 | Lasser |
| 2011/0149651 A1 | 6/2011 | Gorobets et al. |
| 2011/0258391 A1 | 10/2011 | Atkisson et al. |
| 2011/0314354 A1 | 12/2011 | Fillingim |
| 2012/0278512 A1 | 11/2012 | Alatorre et al. |
| 2013/0055254 A1 | 2/2013 | Avasthi et al. |
| 2013/0173844 A1* | 7/2013 | Chen ............ G06F 12/0246 711/103 |
| 2013/0311745 A1* | 11/2013 | Harris ............ G06F 3/0611 711/171 |
| 2014/0095827 A1 | 4/2014 | Wei et al. |
| 2014/0143474 A1 | 5/2014 | Damle et al. |
| 2014/0143488 A1* | 5/2014 | Snaman, Jr. ....... G06F 3/0607 711/114 |
| 2014/0192583 A1 | 7/2014 | Rajan et al. |
| 2014/0208004 A1 | 7/2014 | Cohen et al. |
| 2014/0237298 A1 | 8/2014 | Pe'er |
| 2015/0012794 A1 | 1/2015 | Losh et al. |
| 2015/0067418 A1 | 3/2015 | Lee |
| 2015/0082014 A1 | 3/2015 | Funaki et al. |
| 2015/0154061 A1 | 6/2015 | Camp et al. |
| 2016/0110252 A1 | 4/2016 | Hyun et al. |
| 2016/0216894 A1* | 7/2016 | Nango ............ G06F 3/0604 |
| 2016/0274800 A1 | 9/2016 | Earhart |
| 2016/0274970 A1 | 9/2016 | Earhart |
| 2016/0283308 A1 | 9/2016 | Earhart |

\* cited by examiner

MEMORY PARTITIONING STORAGE CONTROLLER

RELATED APPLICATIONS

This application hereby claims the benefit of and priority to U.S. Provisional Patent Application No. 62/136,336, titled "SEQUENTIAL WRITE/RANDOM READ STORAGE CONTROLLER", filed on Mar. 20, 2015 and which is hereby incorporated by reference in its entirety.

TECHNICAL FIELD

Aspects of the disclosure are related to data storage and in particular to sequential write/random read storage controllers.

TECHNICAL BACKGROUND

Flash non-volatile storage devices are commonly used in computers as high-speed solid state storage devices. These devices require flash memory controllers that typically work as random write/random read, small data block devices. Their data block size is typically 8-16 KB. Since these devices provide random write/random read data traffic, performance requirements limit the amount of error correction and data protection that may be used without reducing performance.

Further, these flash controllers require a small block flash translation layer (FTL) which is a mapping of host based small blocks into pages within the flash memory device. Flash translation layers are typically complex and create additional processes for the flash controller to manage such as garbage collection, management of a very large translation table, wear leveling, power fail recovery, and the like. Because of these requirements, flash translation layers are expensive in terms of area and power within the flash controller, and also reduce performance and increase wear.

Overview

In an embodiment, a storage controller for a storage system is provided. The storage controller includes a host interface, configured to receive host data for storage within the storage system, a storage interface, configured to transmit storage data to the storage system, and processing circuitry coupled with the host interface and the storage interface. The processing circuitry is configured to receive a request from a partition creator, for a first partition within the storage system, the first partition comprising one or more sequentially numbered data blocks, and to receive first partition parameters from the partition creator, the first partition parameters comprising a size of the one or more sequentially numbered data blocks.

The processing circuitry is also configured to create the first partition within the storage system, through the storage interface, based on the first partition parameters, receive first host data from a host, configure the first host data as first storage data for storage within the first partition, and to sequentially store the first storage data in the one or more sequentially numbered data blocks in the first partition, through the storage interface.

In another embodiment, a method of operating a storage controller is provided. The method includes receiving a request from a partition creator, for a first partition within a storage system, the first partition comprising one or more sequentially numbered data blocks, and receiving first partition parameters from the partition creator, the first partition parameters comprising a size of the one or more sequentially numbered data blocks.

The method also includes creating the first partition within the storage system, through a storage interface, based on the first partition parameters, receiving first host data from a host, configuring the first host data a first storage data for storage within the first partition within the storage system, and sequentially storing the first storage data in the one or more sequentially numbered data blocks in the first partition, through the storage interface.

In a further embodiment, one or more non-transitory computer-readable media having stored thereon program instructions to operate a storage controller for a storage system are provided. The program instructions, when executed by processing circuitry, direct the processing circuitry to at least receive a request from a partition creator, for a first partition within the storage system, the first partition comprising one or more sequentially numbered data blocks, and to receive first partition parameters from the partition creator, the first partition parameters comprising a size of the one or more sequentially numbered data blocks.

The programming instructions further direct the processing circuitry to at least create the first partition within the storage system, through a storage interface, based on the first partition parameters, receive first host data from a host, configure the first host data as first storage data for storage within the first partition, and to sequentially store the first storage data in the one or more sequentially numbered data blocks in the first partition, through the storage interface.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
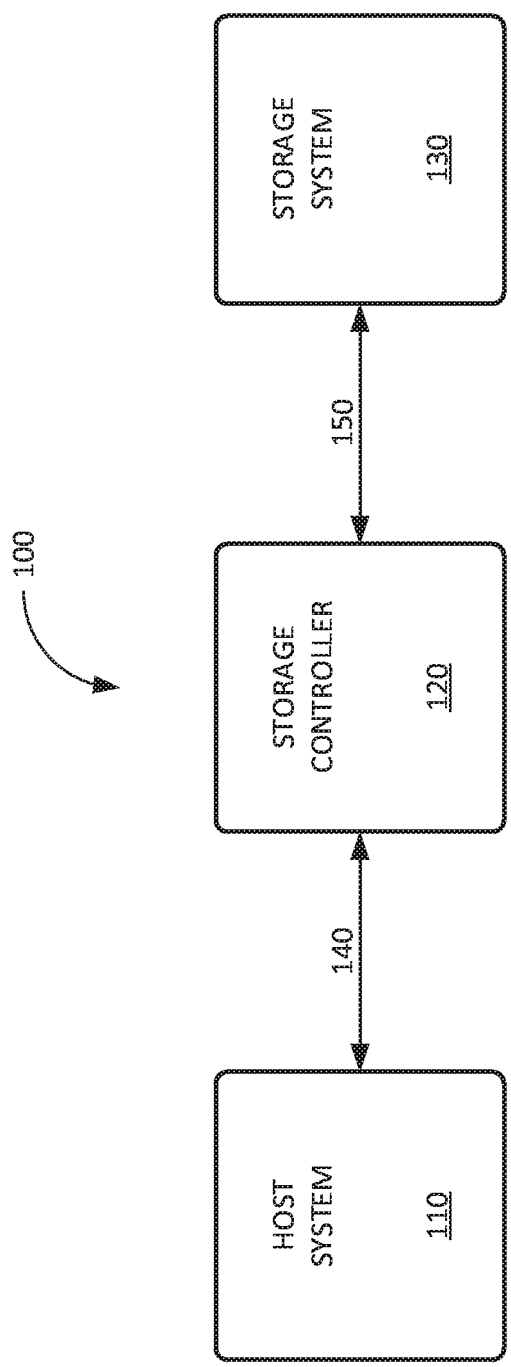
FIG. 1 illustrates a computer host and data storage system.

FIG. 1 illustrates computer host and data storage system 100. In this example embodiment, host system 110 sends data to, and receives data from, storage controller 120 for storage in storage system 130. In an example embodiment, storage system 130 comprises flash non-volatile memory, such as NAND memory. NAND memory is just one example, other embodiments of storage system 130 may comprise other types of storage. Storage controller 120 communicates with storage system over link 150, and performs the function of configuring data received from host system 110 into a format that efficiently uses the memory resources of storage system 130.

In this example, storage controller 120 provides data to storage system 130 using a sequential write/random read traffic flow. This traffic flow provides a number of advantages over the small data block random write/random read traffic flow typically used with flash non-volatile memory. In particular, the sequential write/random read traffic flow provides for efficient use of memory within the storage array and offers performance improvements including the availability of multiple, bi-directional data streams that are mapped to different partitions within storage system 130. These partitions may be configured individually with a desired partition size, data block size, storage density, physical memory attributes, protection attributes, security level, quality of service requirements, data type, data source, data stream attributes, and the like.

Partitions may be created or requested by different systems within computer host and data storage system 100. In some examples, host system 110 sends a request for a partition to storage controller 120 along with the parameters used to configure the partition. In other cases, a media emulation layer within storage controller 120 may create partitions for use in managing host data such as caching between partition, storing tables, performing garbage collection across partitions, and the like. Further, storage controller 120 itself may create partitions for system area data storage. In all cases, the partition creator owns the partition and defines the partition attributes sing the partition parameters).

Storage controller 120 provides translation between standard storage interfaces and command protocols used by host system 110 to a command protocol and the physical interface used by storage devices within storage system 130. Additionally, storage controller 120 may emulate different media types such as a hard disk drive, tape drive, or the like, allowing host system 110 to interface with storage system 130 as if it were a hard disk drive, tape drive, or the like. In such an emulation mode, storage controller 120 translates between host system 110 and storage system 130, configuring data traffic and translating commands between the format of the media type desired by host system 110 and the protocol used by storage system 130.

Within a single storage system 130 different partitions may be used to emulate different media types, with storage controller 120 managing the different data traffic streams and configuring the data, along with translating the commands in each stream as necessary.

Additionally, storage controller 120 implements error correction code (ECC) encode/decode functions, along with data encoding, data recovery, retry recovery methods, and other processes and methods to optimize data integrity. Storage controller 120 includes the ability to provide multi-level ECC correction over a wide range of data block sizes, allowing for the correction of data errors both large and small. ECC correction levels are determined on a per partition basis by the partition parameters used to create each partition.

Storage controller 120 may take any of a variety of configurations. In some examples, storage controller 120 may be a Field Programmable Gate Array (FPGA) with software, software integrated with a memory buffer, an Application Specific Integrated Circuit (ASIC) designed to be included in a single module with storage system 130, a set of Hardware Description Language (HDL) commands, such as Verilog or System Verilog, used to create an ASIC, a separate module from storage system 130, built in to storage system 130, or any of many other possible configurations.

Host system 110 communicates with storage controller 120 over various communication links, such as communication link 140. These communication links may use the Internet or other global communication networks. Each communication link may comprise one or more wireless links that can each further include Long Term Evolution (LTE), Global System For Mobile Communications (GSM), Code Division Multiple Access (CDMA), IEEE 802.11 WiFi, Bluetooth, Personal Area Networks (PANs), Wide Area Networks, (WANs), Local Area Networks (LANs), or Wireless Local Area Networks (WLANs), including combinations, variations, and improvements thereof. These communication links can carry any communication protocol suitable for wireless communications, such as Internet Protocol (IP) or Ethernet.

Additionally, communication links can include one or more wired portions which can comprise synchronous optical networking (SONET), hybrid fiber-coax (HFC), Time Division Multiplex (TDM), asynchronous transfer mode (ATM), circuit-switched, communication signaling, or some other communication signaling, including combinations, variations or improvements thereof. Communication links can each use metal, glass, optical, air, space, or some other material as the transport media. Communication links may each be a direct link, or may include intermediate networks, systems, or devices, and may include a logical network link transported over multiple physical links.

Storage controller 120 communicates with storage system 130 over link 150. Link 150 may be any interface to a storage device or array. In one example, storage system 130 comprises NAND flash memory and link 150 may use the Open NAND Flash Interface (ONFI) command protocol, or the "Toggle" command protocol to communicate between storage controller 120 and storage system 130. Other embodiments may use other types of memory and other command protocols. Other common low level storage interfaces include DRAM memory bus, SRAM memory bus, and SPI.

Link 150 can also be a higher level storage interface such as SAS, SATA, PCIe, Ethernet, Fiber Channel, Infiniband, and the like. However—in these cases, storage controller 120 would reside in storage system 130 as it has its own controller.

Figure 2:
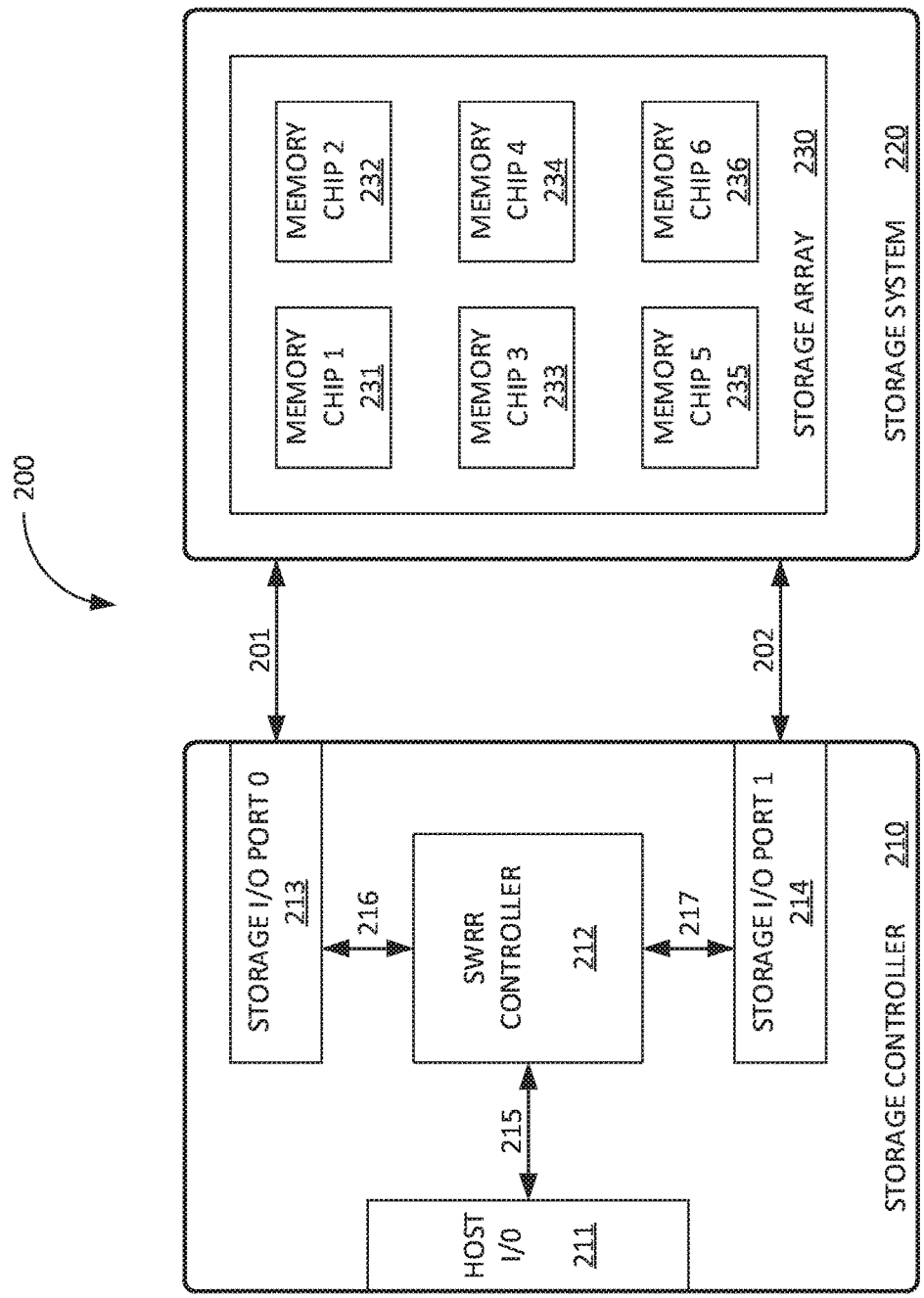
FIG. 2 illustrates a data storage system.

FIG. 2 illustrates data storage system 200. This example system comprises storage controller 210 and storage system 20. Storage system 220, comprises storage array 230. Storage array 230 comprises memory chips 1-6 (231-236). In an example embodiment, each memory chip 231-236 is a NAND memory integrated circuit. Other embodiments may use other types of memory.

Storage controller 210 comprises a number of blocks or modules including host I/O interface 211, sequential write/random read (SWRR) controller 212, storage I/O port 0 213, and storage I/O port 1 214. Sequential write/random read controller 212 communicates with the other blocks over links 215, 216, and 217. Storage I/O port 0 213 communicates with storage system 220 over link 201 and storage I/O port 1 214 communicates with storage system 220 over link IP.

In some example embodiments, storage I/O ports 0 and 1 (213 and 214) may use the Open NAND Flash Interface (ONFI) command protocol, or the "Toggle" command protocol to communicate with storage system 220 over links 201 and 201. The ONFI specification includes both the physical interface and the command protocol of ONFI ports 0 and 1. The interface includes an 8-bit bus (in links 201 and 202) and enables storage controller 210 to performed, program, erase, and other associated operations to operate memory chips 1-6 (231-236) within storage array 230.

Multiple memory chips may share each ONFI bus, however individual memory chips may not share multiple ONFI buses. Chips on one bus may only communicate with that bus. For example, memory chips 1-3 (231-233) may reside on bus 201, and memory chips 4-6 (234-236) may reside on bus 202.

In this example, sequential write/random read controller 212 receives host data from a host through host I/O interface 211 over link 215. Sequential write/random read controller 212 configures the data as needed for storage in storage system 220 and transfers the data to storage I/O ports 0 and 1 (213 and 214) for transfer to storage system 220 over links 201 and 202.

Figure 3:
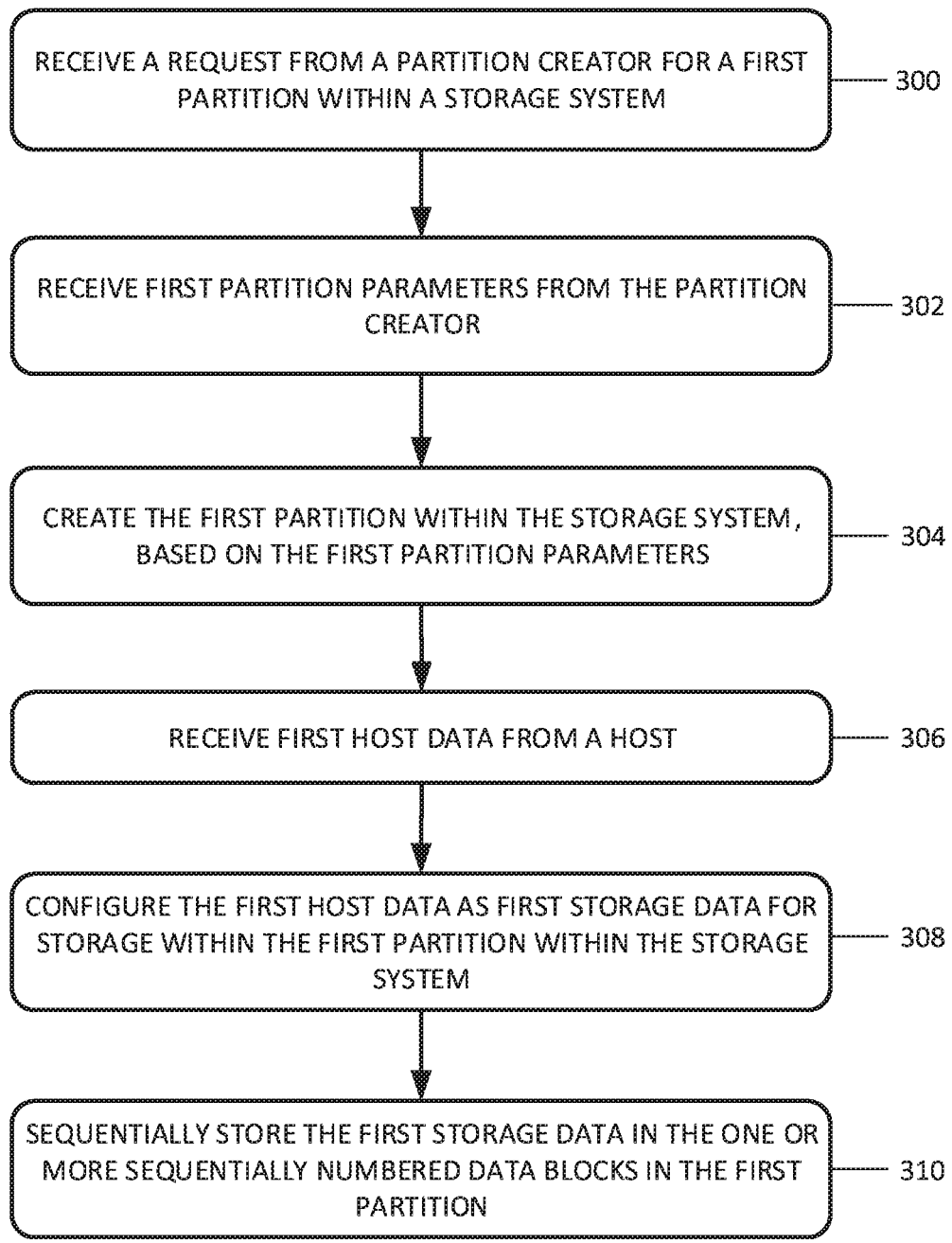
FIG. 3 illustrates a method for operating a storage controller.

FIG. 3 illustrates a method for operating storage controller 210 as illustrated in FIG. 2. Storage controller 210 receives a request from a partition creator, such as host 110, for a first partition within storage system 220, (operation 300). The first partition comprises one or more sequentially numbered data blocks.

Storage controller 210 receives first partition parameters from the partition creator, (operation 302). The first partition parameters include a quantity or size of the one or more sequentially numbered data blocks. Storage controller 210 creates the first partition within storage system 220, through storage I/O ports 0 and 1 (213 and 214), based on the first partition parameters, (operation 304). In some examples, storage controller 210 performs wear leveling on the memory cells within storage system 220, by selecting data blocks or data block stripes for the partition based at least in part on how many times they have been erased (using their erase count, which is stored in a table by storage controller 210).

Storage controller 210 receives first host data from host system 110, (operation 306). Sequential write/random read controller 212 within storage controller 210 configures the first host data as first storage data for storage within storage system 220, optionally using a sequential write/random read traffic model, (operation 308). Storage controller 210 then sequentially stores the first storage data in the one or more sequentially numbered data blocks in the first partition, through storage ports 0 and 1 (3 and 214), (operation 310).

In this example embodiment, storage system 220 comprises NAND flash memory, however, other embodiments may use other memory types. NAND flash drives include Solid-State Drives (SSDs), USB memory sticks, Secure Digital (SD) cards, eMMC (embedded Multi-Media Card)/UFS (Universal Flash Storage) embedded controllers, and the like.

Figure 4:
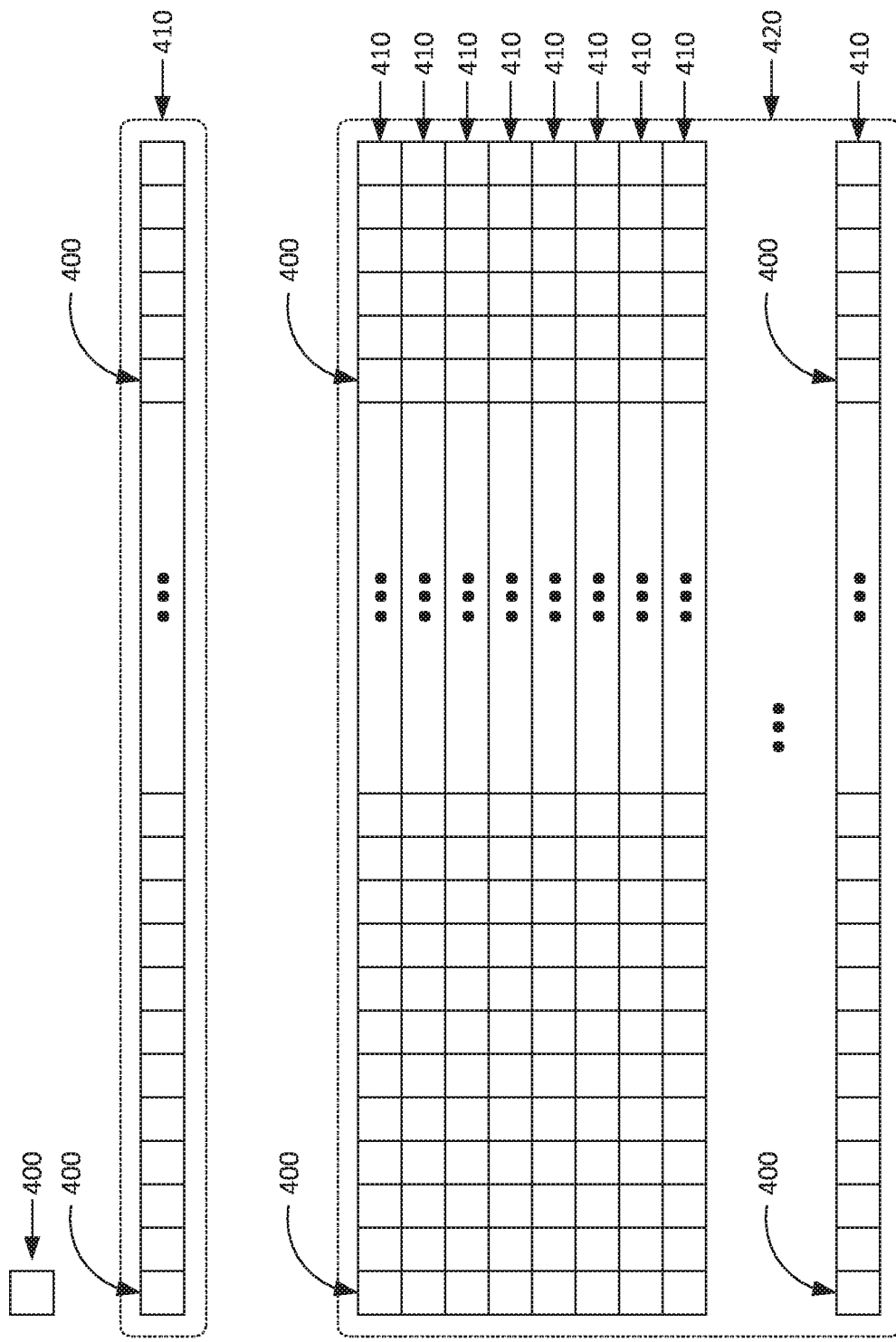
FIG. 4 illustrates an example of memory storage cell organization.

FIG. 4 illustrates an example of data storage cell organization. NAND flash non-volatile storage systems are organized as an array of memory cells 400 surrounded by control logic to allow it to be programmed, read, and erased. The cells in a typical flash array are organized in pages 410 for program and read operations. Multiple pages 410 are in a data (NAND) block 420 and usually must be written sequentially within a data block 420. Erase operations are done on a data block 420 basis.

Figure 5:
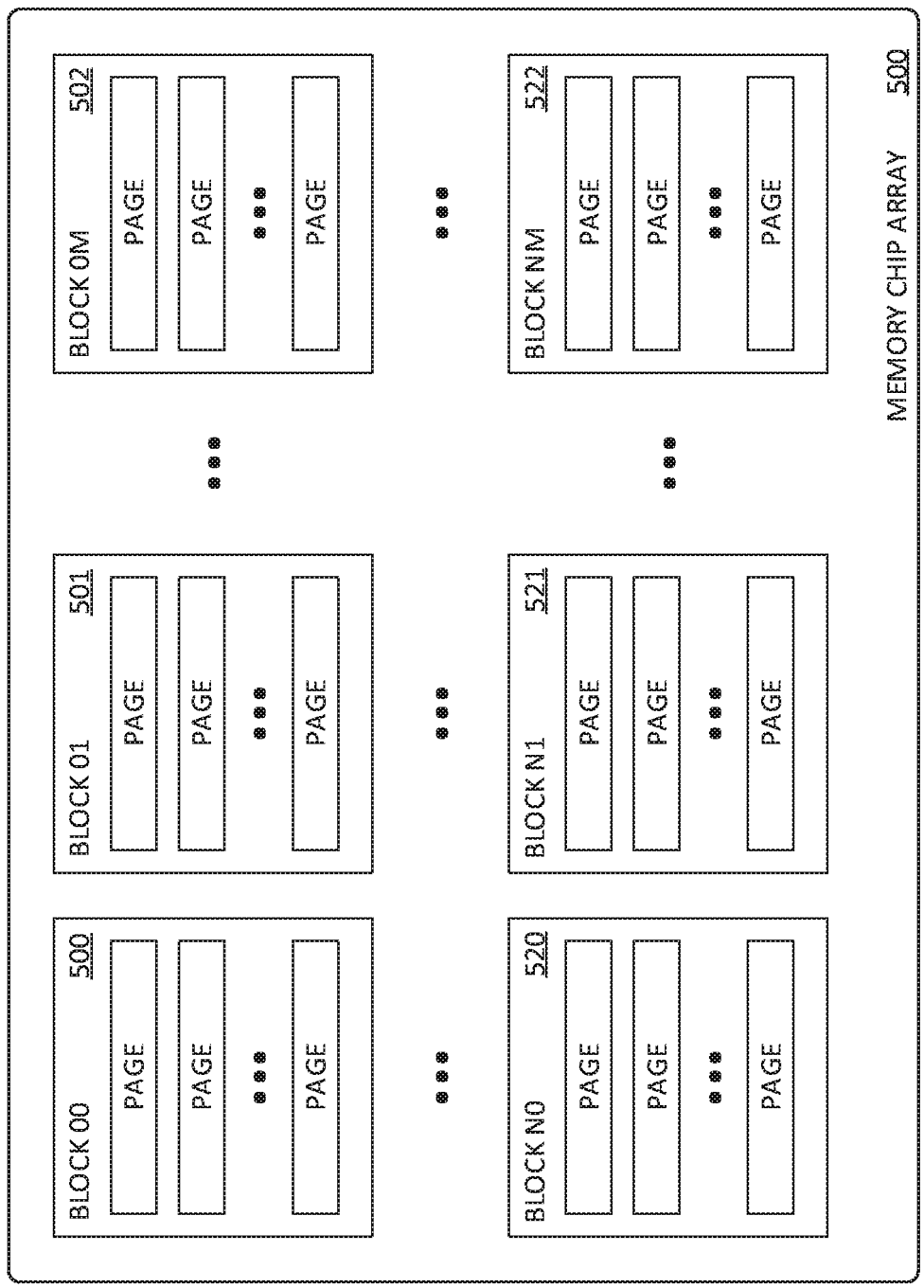
FIG. 5 illustrates a memory chip array.

FIG. 5 illustrates memory chip array 500. Memory chip array 500 within a die (chip/integrated circuit) comprises multiple data (NAND) blocks 500-522. The page 410, data block 420 and array 500 sizes vary by flash die design. Typical sizes are currently 16 KB pages, 512 pages per data block, and 1024 data blocks per die. These sizes continue to grow as memory die increase capacity.

The memory chip array 500, when using NAND flash memory data cells, is controlled externally by the industry standard ONFI (Open NAND Flash Interface) specification or the "Toggle" interface specification. The ONFI specification includes both the physical interface and the command protocol. The interface has an 8-bit bus and enables a controller to perform program, read, erase, and associated operations to operate the NAND die. Multiple die can share an ONFI bus.

Most NAND memory systems are built out of an array of NAND die to increase performance and capacity. Multiple NAND die can be packaged together, multiple packages can be assembled together on assemblies, and multiple assemblies can exist within a NAND memory system. The entire set of NAND memory being controlled is referred to as the storage array.

In order to use NAND memory in a system, a storage controller is required. The controller has many functions including, but not limited to: converting between ONFI and standard storage interfaces and command protocols, organizing data across the storage array, adding metadata and/or tables to keep track of the data written and where it is mapped in the array, implementing ECC encode/decode, data encoding, recovery, retry recovery algorithms, and other processes and lgorithms to optimize data integrity, and NAND and array management functions to optimize storage usage, capacity, performance, life, and power.

Figure 6:
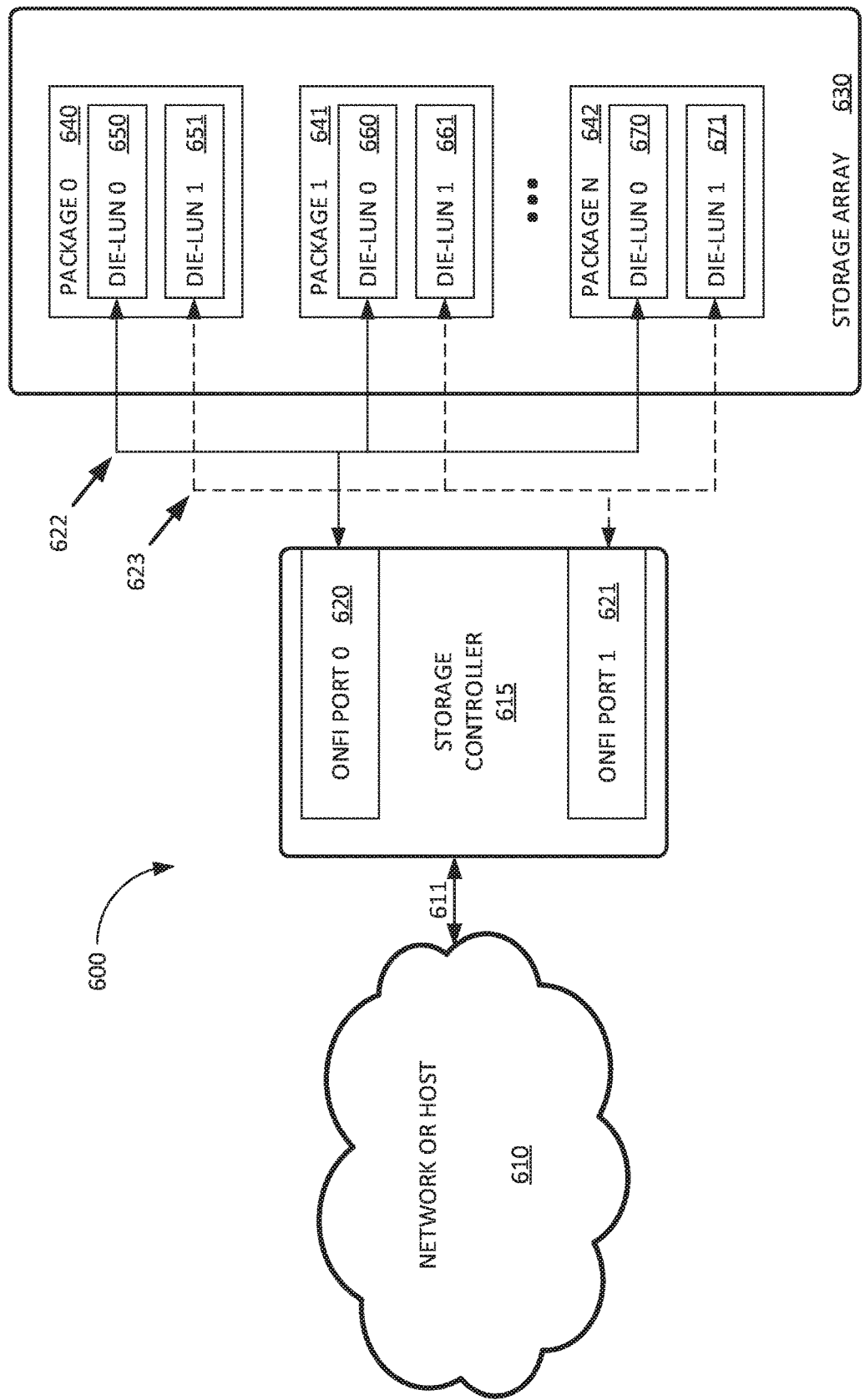
FIG. 6 illustrates a data storage system.

FIG. 6 illustrates data storage system 600. This example includes network or host system 610, storage controller 615, and storage array 630. Host system 610 and storage controller 615 exchange data over link 611. Storage controller 615 and storage array 630 exchange data and commands over ONFI buses 622 and 623. Storage controller 615 includes ONFI port 0 620 which exchanges data and commands with storage array 630 over ONFI bus 622 and ONFI port 1 621 which exchanges data and commands with storage array 630 over ONFI bus 623.

Storage array 630 comprises a plurality of packages 640-642 each containing two NAND dies (DIE-LUN (Logical Unit Number) 0 and 1). In this example, ONFI port 0 620 sends data and commands to all of the memory dies having a logical unit number of "0". This includes DIE-LUN 0 650 in package 0 640, DIE-LUN 0 660 in package 1 641, and DIE-LUN 0 in package N 642. ONFI port 1 621 sends data and commands to all of the memory dies having a logical unit number of "1". This includes DIE-LUN 1 651 in package 0 640, DIE-LUN 1 661 in package 1 641, and DIE-LUN 1 in package N 642. The ONFI ports may operate simultaneously to provide enhanced bandwidth.

This example is a storage controller 615 that is optimized to operate in a sequential write/random read mode. The example description focuses on the implementation with NAND flash, but the example is not intended to be limited to NAND flash storage array control. The controller of this example can be applied to any non-volatile storage technology that requires an integrated control function packaged with the medium in order to operate. Storage controller 615 is also referred to as "SWRR controller".

The SWRR controller 615 of this example implements a method of organizing and managing the data of the array and is optimized for the type of traffic that best suits a NAND storage array or other storage devices with similar characteristics. The traffic definition and behavior includes: multiple, bi-directional data streams that are mapped to different partitions, sequential writing is done using sequentially numbered data blocks.

In order for SWRR controller 615 to perform sequential write/random read traffic flows with storage array 630, rewrites of a data block in a partition without an intervening erase is not allowed, and data blocks within a partition may not be written out of order. Storage controller 615 supports random reads using numbered data blocks. Also, data block sizes are programmable per partition within storage array 630.

Figure 7:
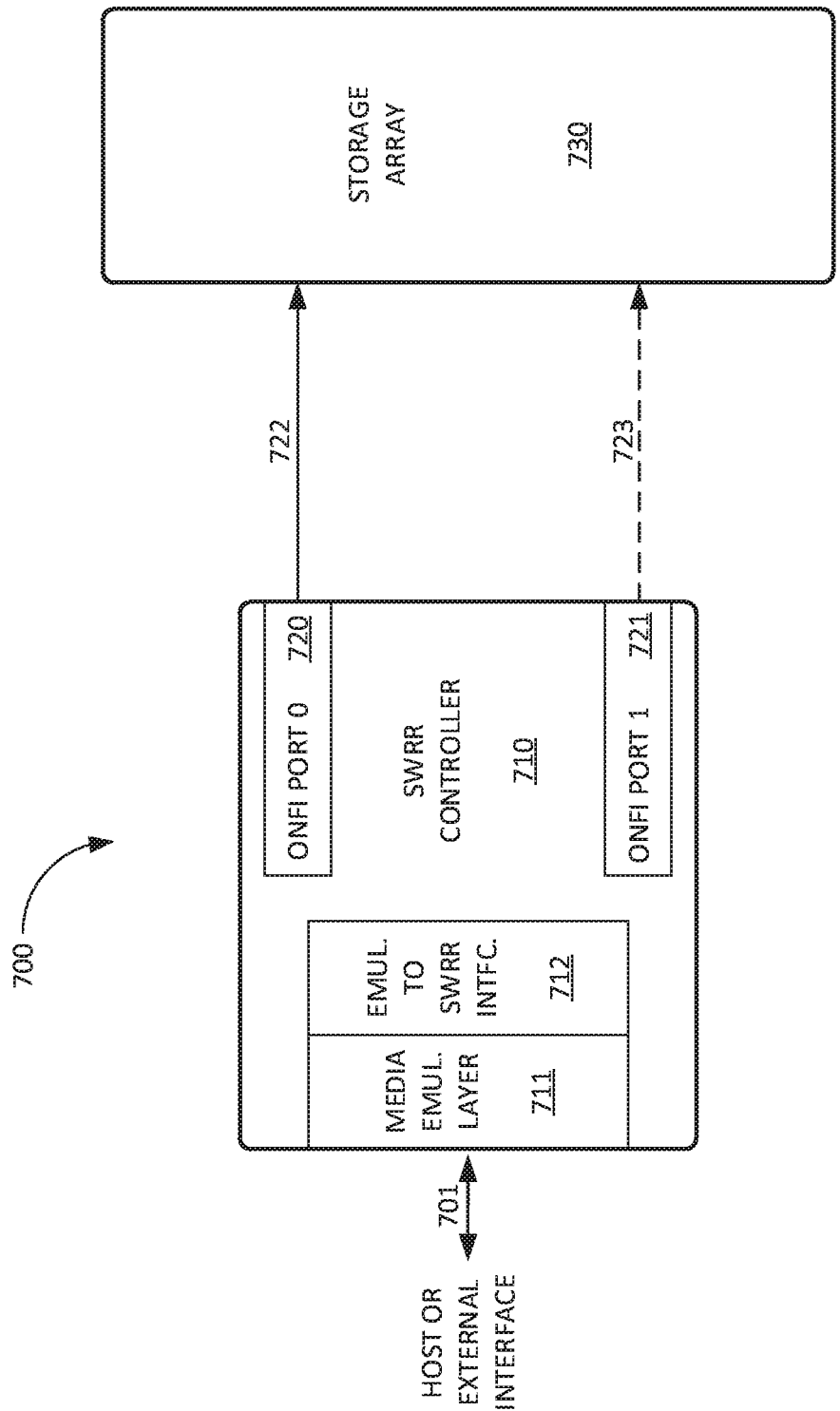
FIG. 7 illustrates a data storage system including a media emulation layer.

FIG. 7 illustrates data storage system 700 including a media emulation layer (also referred to as a visualization layer) 711. In this example the ingress interface to SWRR controller 710 includes media emulation layer 711. Media emulation layer 711 includes all of the command translation, data mapping, management, and tracking needed to adapt SWRR controller 710 to work in many modes and with many interfaces. Media emulation layer 711 also performs any functions required to shape the data traffic to match the SWRR traffic model.

The data traffic at emulation to SWRR interface 712 shown in FIG. 7 matches the sequential write/random read traffic model as described above. The egress interface to storage array 730 is a multi-channel ONFI interface (ONFI ports 0 and 1 (720 and 721)) in the case of a NAND flash array. However, the ONFI interface can be adapted or replaced to directly interface to many different types of storage technologies.

Figure 8:
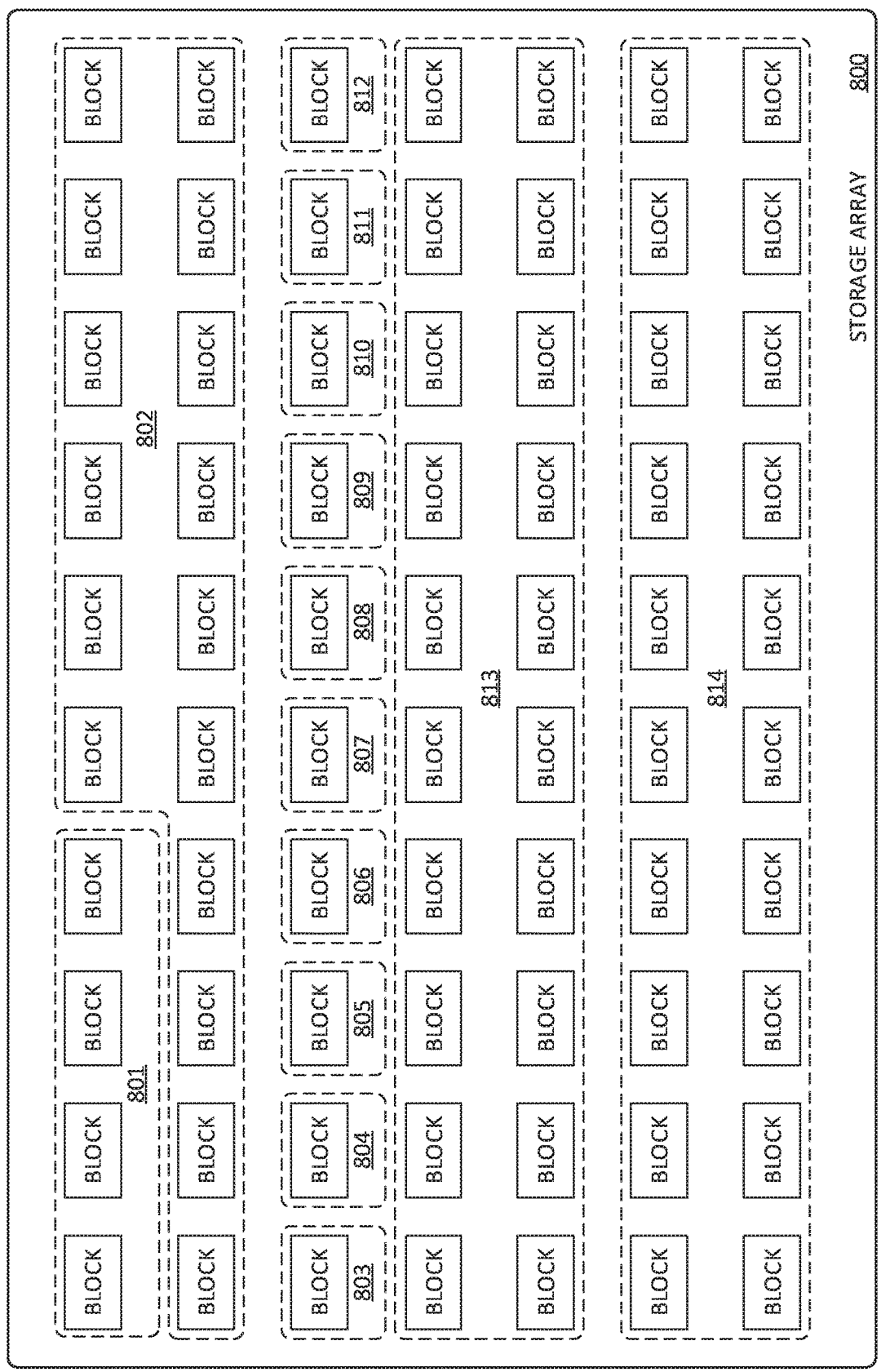
FIG. 8 illustrates an example of storage array organization.

FIG. 8 illustrates an example of storage array 800 organization. Storage array 800 is made up of a lame number of data blocks that are contained in multiple die, packages, and, possibly, assemblies. For a fresh storage array that has yet to have any data stored in it, it is seen by a storage controller as a large pool of free data blocks.

The SWIM controller uses programmable data blocks instead of fixed, 512 or 4K Byte blocks. The data block size can be optimized for the system and, for NAND, are typically at least the size of a page. In addition, the large, programmable blocks allow the system to be optimized to fit the storage array and the host system during configuration time. Another advantage of large data blocks is that it makes the controller scale to larger array sizes much more easily.

The data blocks are organized into data block stripes. A data block stripe contains 1 or more data blocks and is programmable. The highest level structure that controls how the array is accessed is a partition. All data is stored in partitions. A partition consists of any integer number of data block stripes. Each partition has a specific definition and size. Prior to storing any data, one or more partitions need to be created.

In this example, storage array 800 comprises 14 partitions. Partition 1 801 includes 4 data blocks. Partition 2 802 includes 16 data blocks. Partitions 3-12 (803-812) each include one data block, and partitions 13 and 14 (813 and 814) each include 20 data blocks.

All data is written in partitions. Each partition has its own definition, comprising one or more partition parameters.

Partitions can be static, extendable, or linked. They can also be created or destroyed at any time. When a partition is created, it must have at least one block from the free pool assigned. A partition may be destroyed if it has no valid data in it meaning it hasn't been written to yet or it has been erased.

Static partitions are defined as a fixed set of blocks and they cannot change unless they are destroyed.

Extendable partitions can grow as needed. Additional blocks from the free pool may be assigned as needed to keep it from filling up prior to filling the entire storage array. Extendable partitions are useful so that the array doesn't have to be fully allocated without prior knowledge of how much space is needed in each partition.

Linked partitions can be either static or dynamic. Linked partitions are treated logically as a single partition. This feature is useful when a large sequential write session has filled a partition, but there is additional data to append later. Another use of linked partitions is for mixing densities within a data stream or to provide a caching function. Linked partitions need to have compatible attributes—but not identical. The primary areas of compatibility are data type, security level, and Quality of Service (QoS). Partition definitions can only change when they are created or erased.

There are many partition parameters to allow the controller to be optimized to many storage arrays and hosts. The categories of parameters are:

Data block size.
Physical storage cell density—e.g. SLC (Single Level Cell), MLC (Multi Level Cell), TLC (Triple Level Cell), etc.
Protection—number of codeword levels, codeword sizes, ECC type and overhead, etc.
Security—type of encryption, key and password handling, access rights, and digital rights management attributes.
Quality of Service—different priorities of traffic, support of isochronous streams, etc.
Data type and source—e.g. system, host, local array, network, etc.
Physical—number of data block stripes, number of data blocks per data block stripe, location of data blocks in the partition.
Data stream definition—interface type (e.g. fixed blocks, stream, bulk USB, etc.), file/data format (e.g. host block definition, file system awareness, etc.), interface source—for controllers with multiple active interfaces, etc.

As these parameters are set on a per partition basis, it ables straightforward implementation of multiple features such as SLC caching, mixing data security levels, support of multiple types of virtual devices and voltages simultaneously, and supporting different levels of protection based on data type or source as just a few examples.

Figure 9:
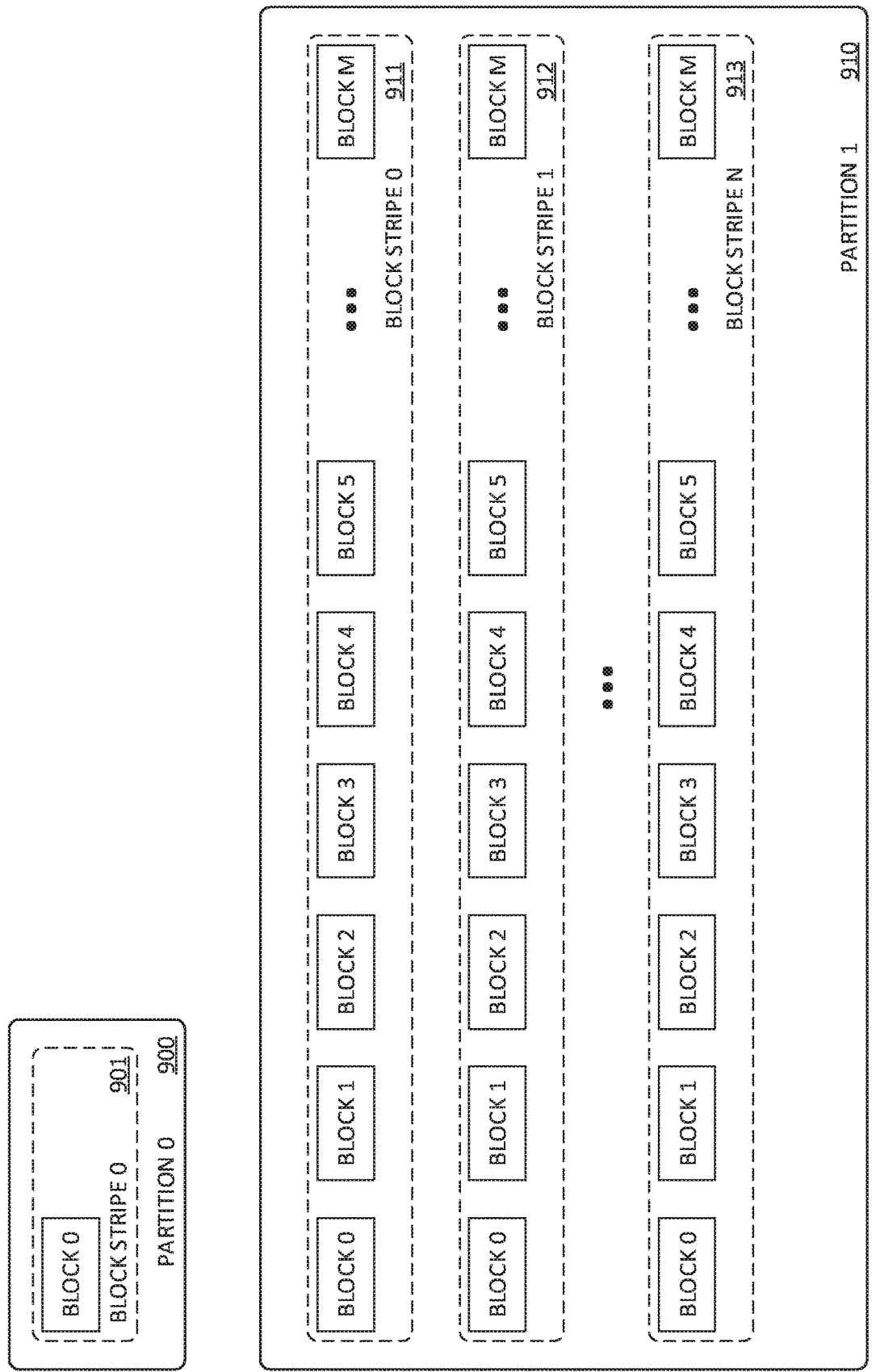
FIG. 9 illustrates storage array partition examples.

FIG. 9 illustrates storage array partition examples. This example illustrates two, more detailed examples of partitions. Partition 0 900 is the smallest possible with only one data block within one data block stripe 910. It may be used for internal system data such as configuration, table storage, NAND optimization parameters, manufacturing data, firmware upgrades, and the like. In this case, partition 0 900 is a "system" partition meaning that it is used only for data internally generated by the controller.

Partition 1 910 is very large and consists of M by N data blocks arranged in multiple integer data block stripes 911-913. A data block stripe is a group of data blocks that are written in parallel to increase performance and optimize data protection. The data block members of a data block stripe can be split across dies, packages, or cards.

Once defined, a partition is filled sequentially with layered codewords. The partition is full when the remaining space is smaller than the highest level/largest size of codeword. A partition can only be filled once. Once it is full, it is read only.

A partition can be erased in block stripes, or as a full partition unit. Once a partition has been erased, the data blocks from that partition are returned to the free pool. The partition can then be re-used, re-configured, or destroyed. New partitions can be created at any time with any size using data blocks from the free pool that are available.

When a block stripe is deleted, tables and high level metadata generated in the media emulation layer manage the deletion. A higher level process—normally in the media emulation layer or the host itself, but also posoibly wiihin storage controller 710, will take care of copying all of the valid data from the victim block stripe to new data blocks appended to the end of the partition prior to releasing the block stripe for erase and return to the free pool.

Figure 10:
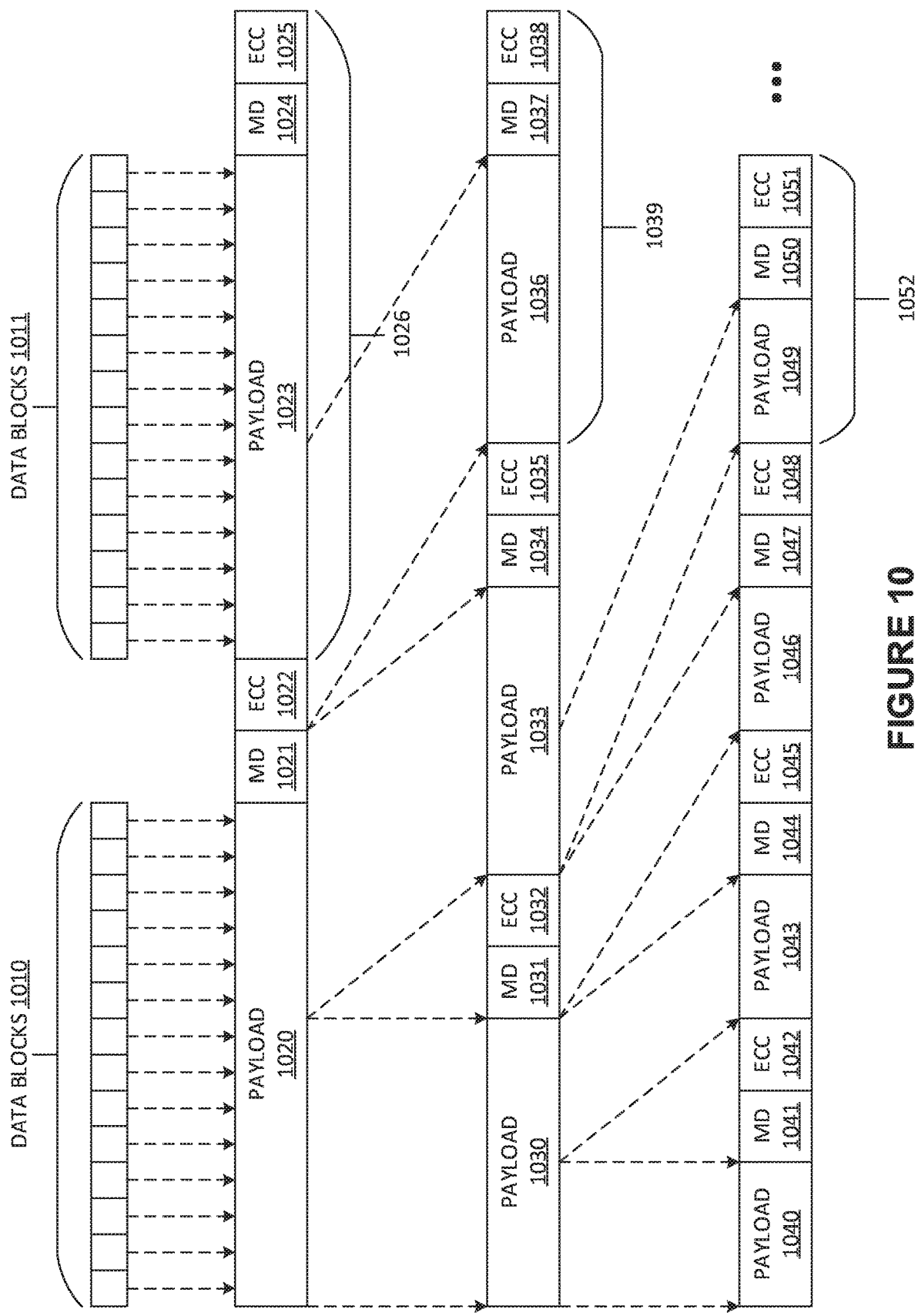
FIG. 10 illustrates an example data organization.

FIG. 10 illustrates an example data organization. The SWRR controller organizes data into partitions. Each partition consists of one or more layers of data encoded with ECC. The number of data layers, their size, and ECC redundancy is programmable during partition creation. This layered, configurable data protection scheme is extremely flexible, resulting in more powerful error correction with less overhead.

The SWRR controller can have one or more levels of codewords. The example in FIG. 10 shows three levels, but there can be more or fewer levels depending on the configuration of the partition. The different levels allow optimizations and trade-offs to be made between performance, overhead, and data reliability. Oftentimes, the codewords at different levels correspond to different physical structures that could fail. The levels allow data redundancy to be designed to recover from these failures.

As an example, the level 1 codeword may be the size of a page and protect from bit cell errors. The level 2 codeword may be the size of a page stripe and protect against data block failures. The level 3 codeword may be much larger and interleaved across die, packages, or card assemblies to protect against die, package, and card assembly failures. There is no requirement that codewords match any physical data boundary.

Each codeword has 3 primary components: payload, metadata, and ECC data.

The payload is the data received from the layer above. For the top layer, the payload is input data (either host or system data).

The second part is the metadata. The metadata describes the layout of the payload data, its addressing, boundaries, mapping, and its characteristics. The metadata field may not always be located at the end of the payload. It can be at the start, after ECC, or interspersed within the payload. The metadata is always covered by ECC.

The ECC field of a codeword contains parity or redundancy data to help correct for read errors. Any type of ECC may be used and, typically, different types are used at different codeword levels. The amount of ECC per codeword is also configurable. In general—especially at levels 2 and above, the ECC code used is systematic. A systematic ECC codeword does not encode the payload data and just adds calculated ECC. Some types of ECC that are supported include BCH, LDPC (Low-Density Parity-Check), turbo codes, and Reed-Solomon. Others can be used as well. Systematic codewords allow the payload to be written to flash in parallel with ECC calculation.

The partition parameters allow the controller to determine the codeword structure. The codeword structure changes by partition definition. The partition definition along with its physical mapping is embedded into the partition as metadata at the partition start and at intervals within the partition.

Codewords do not have to map in integer numbers into the payload of the next higher layer. The metadata in the next higher layer allows the controller to pack/unpack codewords across payload boundaries—as shown in FIG. 10. Additionally, higher layer codewords can be shortened in order to fit into a page, page stripe, or partition boundary.

In this example embodiment, two data blocks 1010 and 1011 from a host system are to be stored using three levels of codewords. In this example, data blocks 1010 and 1011 are the same size as level 3 payloads 1020 and 1023, however there is no requirement for any such size mapping.

Based on level 3 payload 1020, the storage controller create, metadata 1021 and computes ECC 1022. Similarly, based on level 3 payload 1023, the storage controller creates metadata 1024 and computes ECC 1025. The combination of a level 3 payload with metadata and ECC data comprises a level 3 codeword 1026.

Each level 3 codeword is then partitioned into level 2 payloads. In this example, a portion of level 3 payload 1020 becomes level 2 payload 1030, the remaining portion of level 3 payload 1020 and metadata 1021 becomes level 2 payload 1033, and ECC 1022 and a portion of level 3 payload 1023 becomes level 2 payload 1036. This process continues until all of the level 3 codewords have been partitioned into level 2 payloads.

Based on level 2 payload 1030, the storage controller creates metadata 1031 and computes ECC 1032. Similarly, based on level 2 payload 1033, the storage controller creates metadata 1034 and computes ECC 1035, and based on level 2 payload 1036, the storage controller creates metadata 1037 and ECC 1038. The combination of a level 2 payload with metadata and ECC data comprises a level 2 codeword 1039.

Each level 2 codeword is then partitioned into level 1 payloads. In this example, a portion of level 2 payload 1030 becomes level 1 payload 1040, the remaining portion of level 2 payload 1030 becomes level 1 payload 1043, metadata 1031 and ECC 1032 become level 1 payload 1046, and a portion of level 2 payload 1033 becomes level 1 payload 1049. This process continues until all of the level 2 codewords have been partitioned into level 1 payloads.

Based on level 1 payload 1040, the storage controller creates metadata 1041 and computes ECC 1042. Similarly, based on level 1 payload 1043, the storage controller creates metadata 1044 and computes ECC 1045, based on level 1 payload 1046, the storage controller creates metadata 1047 and ECC 104, and based on level 1 payload 1049, the storage controller creates metadata 1050 and ECC 1051. The combination of a level 1 payload with metadata and ECC data comprises a level 1 codeword 1052.

The larger data block sizes and layered codeword design allow customized ECC protection schemes that better fit an array, its traffic model, and potential points of failure. These longer, layered codewords provide stronger data protection with less overhead. The schemes can be tailored to protect against and recover from physical failures such as die, package, and assembly failures.

The ECC scheme can be beefed up as much as needed to reduce the UBER (Uncorrectable Bit Error Rate) below the theoretical UBER of any competing storage technology or system. The improved ECC scheme also allows the use of lower grade, less expensive NAND in high reliability applications.

Beyond managing the partition configuration, memory array usage, and codeword encode/decode described in the previous sections, the memory controller requires other functionality and algorithms to provide a full controller solution.

The memory system needs to store non-user data in order to boot, configure, and operate. This data is referred to as system data and is normally not available through normal write/read commands via the host interface.

Examples of system data include internal firmware, manufacturing data, translation and management tables, statistics, array information, and the like. System data is generated internally and written to partitions that are created and configured specifically for system data. There can be as many system partitions as needed.

Figure 11:
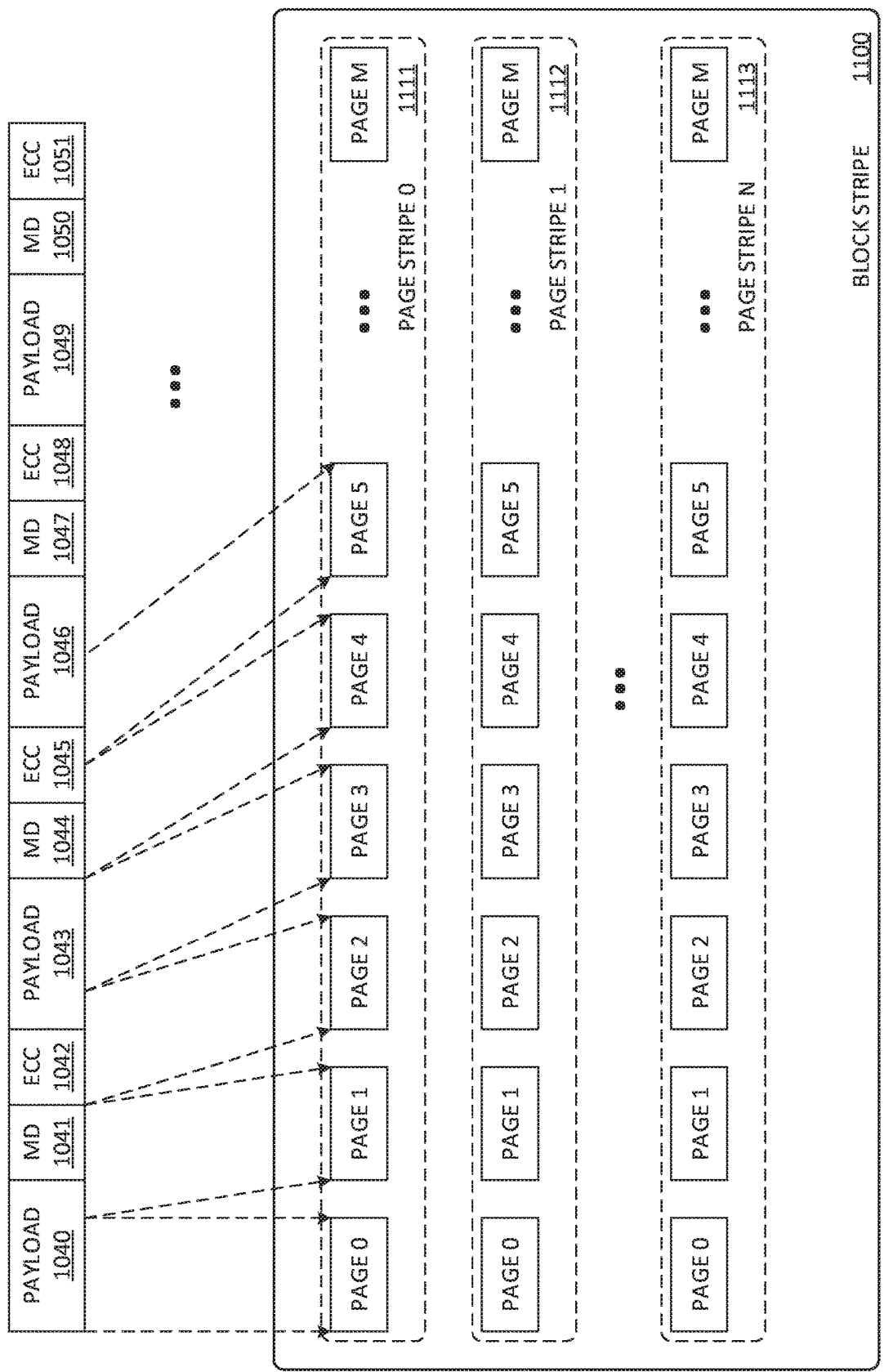
FIG. 11 illustrates an example sequential writing process.

FIG. 11 illustrates an example sequential writing process. Write requests to the storage array are mapped to a partition. Write data can be steered to different partitions based on data type, host ID, or data source.

The storage controller monitors traffic from all active partitions. Any writes competing for shared resources (such as a channel or die), are prioritized based on partition attributes queuing it for write to the storage array. Within a partition, the data is mapped into the payloads of the different levels of codewords.

Each time enough data is available from codeword generation to write a page, the data is transferred to the correct die and a page program command is sent. Each page in the storage array may include some metadata at a fixed position in the page to help locate codeword boundaries for readback.

In this example, the level 1 codewords from FIG. 10 are to be stored in block stripe 1100. Block stripe 1100 includes a N by M array of pages. It includes page stripes 0-N (1111-1113). Each page stripe comprises pages 0-M.

The storage controller partitions the level 1 code words into page-sized chunks of data and sequentially stores these chunks of data into the pages of a page stripe. Once the page strip is full, it moves on and begins storing chunks of data into the pages of the next sequential page stripe.

In this example, a portion of level 1 payload 1040 is stored in page 0 of page stripe 0 1111, the remainder of level 1 payload 1040 and metadata 1042 is stored in page 1 of page stripe 0 1111, and the remaining level 1 codewords are partitioned and sequentially stored in the pages within page stripe 0 1111 until reaching page M of page stripe 0 1111. At that point the storage controller begins storing the level 1 code words in page stripe 1 1112, and continues to fill block stripe 1100 in this manner.

For systematic codewords, the ECC for each level can be accumulated in memory as payload data is written to the array in pages. As the metadata and ECC is generated, it is also written.

For non-systematic codewords, the entire codeword has to be assembled prior to writing it to the array. Codeword assembly includes all levels.

The partition is filled in page stripes across the set of data blocks designated as a data block stripe within the partition.

The write process incorporates a flush operation. There are two types of flush operations: mini and full.

A mini-flush is used to protect buffered data. It updates the current open level 0 codeword metadata to describe the flush and pad out operation. It then pads out the level 0 codeword and then pads out the buffered data to the next legal write unit (a page) and writes it to the array. This is used for temporary interruptions in the data stream or in cases where only a short amount of time is available to write out the data (e.g. imminent power fail).

A full flush updates the metadata and pads out all levels of codewords. It may shorten some of the higher layers of codewords to save capacity. It then pads out the write data to the next desired boundary (page, page stripe, data block stripe, partition). This operation is normally used to close a partition or provide a leaner array write when more time is available to clean up after an error condition that has triggered the flush.

Flush operations are triggered for multiple reasons. Examples include:
1. The host or emulation layer ma request a flush at any point in the data stream either as part of the write command or as a separate command.
2. A programmable timer based on the partition attributes can be set to force a flush.
3. An imminent power fail signal or other hardware unsafe signal can also trigger a flush.

The write process provides an acknowledgement to the upper layers or host each time a specific amount of data has been safely written to the array. The units and size of the acknowledgement is configurable based on the partition. Some example options are every 10 level 0 codewords every 100 data blocks, every data block stripe, every write command, and the like.

The write process keeps track of data block addressing per partition during writes. Any duplicate or out of order data block writes are rejected. This tracking is cleared after an erase.

Both random and sequential reads are supported by the SWRR controller. The read requests are based the data block address. Sequential reads are supported with a partition plus host data block address accompanied by a requested number of data blocks.

Minimum sized physical reads are in pages at the memory array. Minimum sized SWRR reads are in level 0 codewords. Since codeword sizes are variable and can span pages, a minimum data block read may require more than one page to be read.

When a specific data block is requested, the SWRR controller determines the physical location of the data block and reads the physical memory page or pages and level 0 codeword(s) to recover it. The ECC is checked and if the data is good, it is returned. If it is not good, recovery operations are initiated.

The SWRR controller can support multiple read requests across multiple partitions at a time. The requests are mapped and queued to the array using priority rules from the partition definitions and optimized for access.

Erases are performed on a block stripe or partition basis. When a partition is erased, it can be removed, reconfigured, move physically, or remain as an empty partition. A secure erase may also be done to remove the data that was stored in the partition.

Data blocks wear as they are erased. Current NAND technology supports thousands or tens of thousands of erases before they can no longer retain data. The differences are dependent primarily on the process technology and data densities.

Wear leveling is important for NAND controllers to ensure that the array wears uniformly. Wear leveling is performed as part of the partition creation and free block pool management process within the SWRR controller. Erase counts for each data block or partition are maintained for the array and used during partition erasure, creation, and destruction to keep the data block wear relatively uniform across the array. Wear leveling is done via partition management for the SWRR controller instead of on a block basis. Wear leveling is accomplished by the memory controller by selecting data blocks for use in a partition at least in part on their erase counts.

The media emulation layer above the SWFF controller adapts the controller to different operating modes, traffic models, command sets, and interface protocols.

For each media emulation type, the controller ensures that system level behaviors such as power loss, data reliability, capacity, and latency are adhered to.

For media emulation modes that support host traffic that doesn't match the SWRR model, the media emulation layer performs "traffic shaping" to adapt the traffic to fit the SWRR mode.

The major types of operating and traffic models supported include: Sequential Write/Random Read, Fixed, Numbered blocks emulating NAND flash, Optical—CD, Blu-Ray, BD-XL, and the like; Sequential Write/Sequential Read, Fixed, un-numbered blocks emulating tape media; Sequential Write/Random Read, Large variable blocks emulating object based, large data stores; and Random Write/Random Read, Small fixed blocks emulating hard drives and solid state drives.

For all modes, the media emulation layer manages the configuration and setup of partitions it uses. It also must manage any system level configuration associated with the media emulation layer and host interface. This management may also include creation and usage of system partitions.

If needed, the media emulation layer handles some configuration and status commands and/or translates commands and forwards them to the SWRR controller.

There may be more than one emulation object present a controller at a time. Thus, a system can support multiple, mixed virtual devices and volumes at a time.

For those emulation modes that require data translation, mapping information as well as host based addressing and attributes need to be recorded with the data. The media emulation layers define their own metadata fields embedded into the data blocks to perform the mapping. If needed or desired for performance, translation data tables that are stored separately in system partitions can be created to reduce translation times. However, the metadata translation is always defined such that the translation table can be lost and be reconstructed using the metadata.

Sequential Write/Random Read—Fixed Blocks

Traffic Shaping: Depending on partition configuration, the host data block size may not match the data block size. If this is the case, the media emulation layer maps host blocks into data blocks in both directions.

Data Translation: As needed, metadata and tables are used to allow the media emulation layer to translate between host block addresses and data block addresses.

Interface Management and Command Translation: In SWRR mode, the media emulation layer does no command or data translation. The primary function of the media emulation layer is to provide the physical interface and link layer control to ensure an error free command and data transport.

Sequential Write/Sequential Read—Fixed Blocks

The primary media emulation targets fitting this emulation model include tape and optical devices.

Traffic Shaping: Depending on the partition configuration, the host data blocks may need to be translated to data block sizes. Otherwise, there is very little traffic management. If desired, the media emulation layer may implemented ahead in anticipation of a sequential read stream.

Data Translation: Most sequential write/read devices use relative block locations on the media and not absolute block numbers. The media emulation layer in this case keeps track of relative location and assigns block numbers to the data block read/write requests sent on to the controller.

In addition, tape drives have media movement commands that move the relative medium position such as rewind, locate, and search. Along with those commands are filemark and tape mark writes to mark relative medium positions. The media emulation layer takes care of virtualizing these tape features.

The data translation function of the media emulation layer also supports multiple virtual volumes which are mapped to separate partitions.

Interface Management and Command Translation: Most tape drives use the T10 streaming command set. Most optical disks use the T10 Multi-media command set. Common physical interfaces are SAS and FC for tape and SATA and USB for optical Blu-Ray.

Sequential Write, Random Read, Large Variable Blocks

Currently, no storage technologies fit this type of use model, but this is the model for very large data stores. Object based storage model is an example. Using this emulation mode, the SWRR controller can have a direct, higher level interface that hides the storage device type and characteristics from the upper layers.

Traffic Shaping: The native traffic mode of the SWRR controller matches this model. There is very little to do for traffic shaping other than to provide some protection of very large blocks being written from errors and power loss.

Data Translation: The media emulation layer breaks up the large, variable blocks and maps them into data blocks. It uses metadata and system data tables to perform the mapping.

Interface Management and Command Translation: The command interface is very simple for object based storage and related protocols. This requires the media emulation layer to handle a lot of the configuration and management of the overall device characteristics.

Random Write/Random Read—Small Fixed Blocks

This mode fits hard disk drives and SSDs (Solid State Drives).

Traffic Shaping: For writes, the media emulation layer collects the small block random writes into a larger sequential write stream broken up into data block sizes. For reads, the data blocks containing the target data are requested.

Data Translation: Converting the small block random write traffic is exactly what the FTL (Flash Translation Layer) function in a SSD does. Thus, the media emulation layer requires an FTL function to map the small block writes into data blocks. Along with the FTL comes all of the other associated functionality including garbage collection, wear leveling, write coherency, small block rewrite support, and power loss management.

Interface Management and Command Translation: HDDs and SSDs use the T10 block command set. Primary physical interfaces are iSCSI, SAS, NVMe, SATA, and FC. As with the other modes, multiple drives may be emulated.

Since the SWRR controller spans multiple storage models and technology, this section provides a brief overview of other controllers. Available storage controllers include HDD, SSD, USB flash, eMMC (embedded Multi-Media Card) flash and UFS (Universal Flash Storage) flash. All of these controllers fit the random write/read, small fixed block mode. All of them support 512 byte blocks. Some support 4 KByte blocks.

HDD Controllers

This overview only refers to the datapath management portion of HDD controllers. HDD controllers also include servo and magnetic head control functions not referenced here.

Hard disk drive controllers are optimized for the magnetic spinning disk media that they control. The small, fixed size blocks are based on disk sectors that were defined decades ago. The sector size was based on the maximum time that servo and PLL systems could go without fixed patterns for synchronization as the media passes by the head.

When HDD systems were integrated into computers and memory systems, the command set was designed with the assumption that the sector size would never change. This assumption proliferated through driver software, tile systems, and even data transfer protocols to the point where it has become difficult—if not impossible for the sector size to change due to the vast infrastructure.

If the HDD model could/did change to allow larger sectors, the advantages would include increased capacity due to less inter-sector overhead (a few %), increased capacity due to larger ECC codewords (a few %), less command overhead due to smaller numbers of blocks (slightly improved latency), and easier to scale up systems to larger sizes as addresses apply to more data.

The disadvantages of larger sector sizes include wasted space and inefficiencies when writing and reading data that is smaller than a block size.

Small blocks are becoming much less common traffic in HDD workloads as flash devices take over the bus based and first tier storage positions. As HDD moves further back into the storage hierarchy, the traffic profile shifts towards large block sequential.

Shingled HDD

A recent innovation in for HDD is shingled mode recording. In shingled recording, the write tracks overlap each other to increase the density by 20-30%. The cost of doing this is that the tracks must be written in order within a band of tracks. Reading is still random access.

This recording mode essentially turns a HDD into a sequential write, random read device which fits the controller of this example better than a classic HDD controller.

NAND Flash Controllers

NAND flash controllers for USB, SD Card, eMMIC, and all work as random write/random read, small block devices. For this example, small block is any block size that is smaller than a native page size. For NAND, this is 8-16 KB.

These controllers all require what is commonly referred to as a small block FTL (Flash Translation Layer). The FTL is simply a mapping of the host based small blocks into the NAND pages. Implementation of a FTL adds a lot of complexity and requires additional processes to manage. These additional processes include the creation, management, searching, and nonvolatile update of a very large translation table.

Garbage collection is another additional process. As random writes proliferate, the entire array becomes littered with valid and invalid host data blocks. Eventually, the array is fully written, but only portions of it contain valid data. In order to deal with this, valid data must be collected and moved to fresh pages and data blocks so that pages with a lot of invalid data can be erased and re-used. In effect, garbage collection requires data to be written to the array more than 2 time. This effect is called "write amplification".

Wear leveling is also required. Due to the write amplification caused by garbage collection, erases are required much more frequently to the point that block erase is the primary failure mechanism. Wear leveling of the blocks within the array is more important when using a FTL to extend the life.

Power fail recovery must also be provided for. With garbage collection operations in the background moving user data and updating the FTL in volatile memory, there is risk of loss of previously written data if there is power failure.

Power fail recovery with the SWRR controller is much simpler and more robust due to the elimination of garbage collection, addition of a write acknowledge function, and large FTL tables. The translation tables within the SWRR controller are all redundant with metadata and interlocked with write acknowledgement handshakes.

Data protection is also an issue with a FTL. The random access performance requirements for these small block systems limit the levels and sizes of codewords allowable for ECC and data protection. Level 1 codeword protection is fixed to a page size and level 2 is fixed to a block stripe controllers do not employ any layers higher than level 2.

The SWRR controller does not require a random, small block FTL. Due to minimization of data block erases and the elimination of the large FTL table, the life of the storage array is increased in every case. The life increase can be very substantial depending on the traffic type. The complexity associated with a FTL was described previously.

Figure 12:
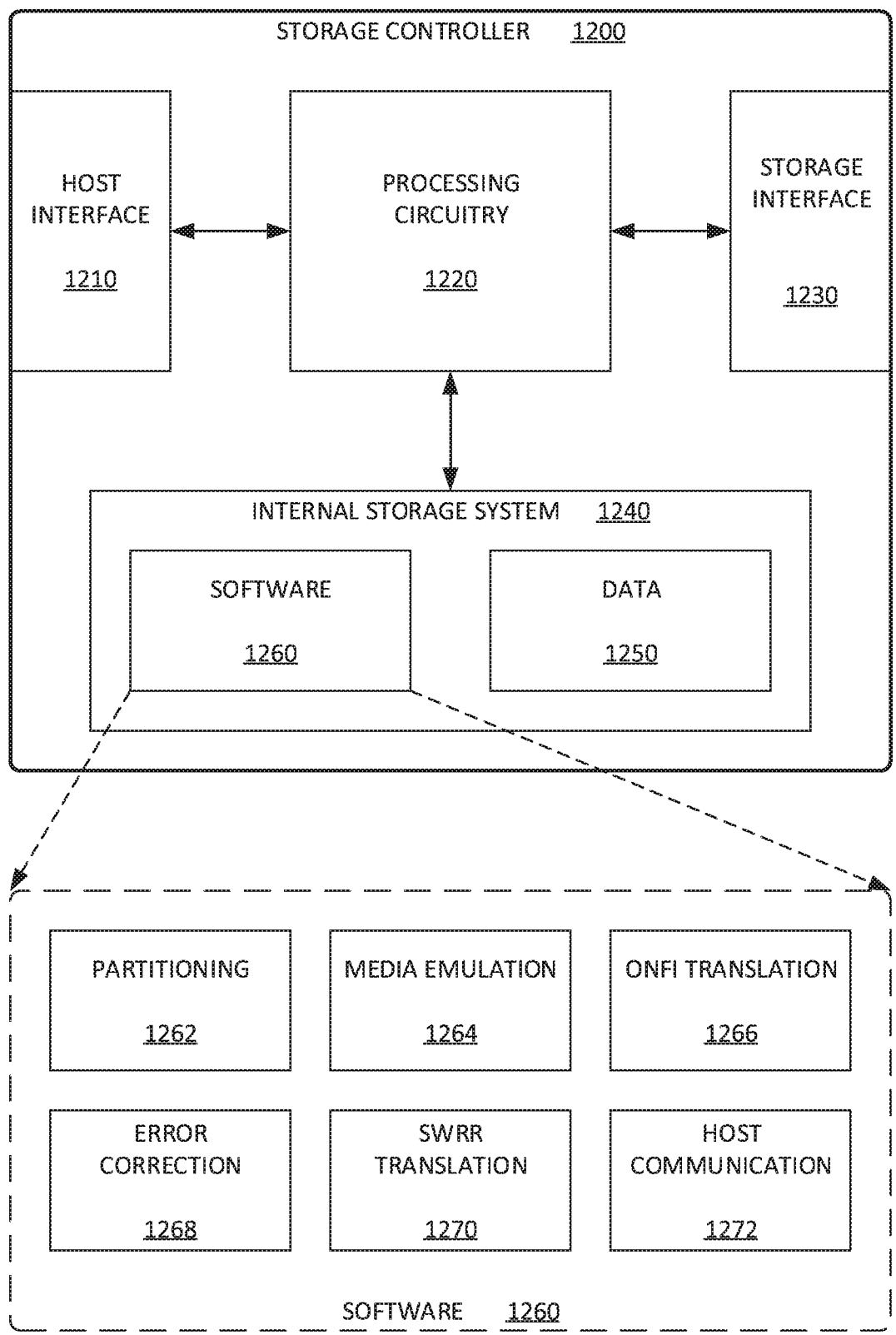
FIG. 12 illustrates a storage controller.

FIG. 12 illustrates storage controller 1200. As discussed above, storage controller 1200 may take on any of a wide variety f configurations. Here, an example configuration is provided for a storage controller implemented as an ASIC. However, in other examples, storage controller 1200 may be built into a storage system or storage array, or into a host system.

In this example embodiment, storage controller 1200 comprises host interface 1210, processing circuitry 1220, storage interface 1230, and internal storage system 1240. Host interface 1210 comprises circuitry configured to receive data and commands from an external host system and to send data to the host system. In some embodiments, host interface 1210 or processing circuitry 1220 may include a media emulation layer.

Storage interface 1230 comprises circuitry configured to send data and commands to an external storage system and to receive data from the storage system. In some embodiments storage interface 1230 may include ONFI ports for communicating with the storage system.

Processing circuitry 1220 comprises electronic circuitry configured to perform the tasks of a SWRR controller as described above. Processing circuitry 1220 may comprise microprocessors and other circuitry that retrieves and executes software 1260. Processing circuitry 1220 may be embedded in a storage system in some embodiments. Examples of processing circuitry 1220 include general purpose central processing units, application specific processors, and logic devices, as well as any other type of processing device, combinations, or variations thereof. Processing circuitry 1220 can be implemented within a single processing device but can also be distributed across multiple processing devices or sub-systems that cooperate in executing program instructions.

Internal storage system 1240 can comprise any non-transitory computer readable storage media capable of storing software 1260 that is executable by processing circuitry 1220. Internal storage system 1220 can also include various data structures 1250 which comprise one or more databases, tables, lists, or other data structures. Storage system 1240 can include volatile and nonvolatile, removable and non-removable media implemented in any method or technology for storage of information, such as computer readable instructions, data structures, program modules, or other data.

Storage system 1240 can be implemented as a single storage device but can also be implemented across multiple storage devices or sub-systems co-located or distributed relative to each other. Storage system 1240 can comprise additional elements, such as a controller, capable of communicating with processing circuitry 1220. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 1260 can be implemented in program instructions and among other functions can, when executed by storage controller 1200 in general or processing circuitry 1220 in particular, direct storage controller 1200, or processing circuitry 1220, to operate as described herein for a storage controller. Software 1260 can include additional processes, programs, or components, such as operating system software, database software, or application software. Software 1260 can also comprise firmware or some other form of machine-readable processing instructions executable by elements of processing circuitry 1220.

In at least one implementation, the program instructions can include partitioning module 1262, media emulation module 1264, ONFI translation module 1266, error correction module 1268, SWRR translation module 1270, and host communication module 1272.

Partitioning module 1262 includes instructions directing processing circuitry 1220 to create, utilize, and maintain partitions within a storage system. Media emulation module 1264 provides a media emulation layer for processing circuitry 1220 and storage controller 1200. ONFI translation module 1266 translates SWRR commands into ONFI commands for use by a storage system. Error correction module 1268 computes error correction codes for storage with a payload in a codeword in a storage system. SWRR translation module 1070 translates host data and commands into data and commands usable by a storage system. Host communication module 1272 interfaces with a host system to provide host data and commands to storage controller 1200 for conversion into storage data and commands usable by a storage system.

In general, software 1260 can, when loaded into processing circuitry 1220 and executed, transform processing circuitry 1220 overall from a general-purpose computing system into a special-purpose computing system customized to operate as described herein for a storage controller, among other operations. Encoding software 1260 on internal storage system 1240 can transform the physical structure of internal storage system 1240. The specific transformation of the physical structure can depend on various factors in different implementations of this description. Examples of such factors can include, but are not limited to the technology used to implement the storage media of internal storage system 1240 and whether the computer-storage media are characterized as primary or secondary storage.

For example, if the computer-storage media are implemented as semiconductor-based memory, software 1260 can transform the physical state of the semiconductor memory when the program is encoded therein. For example, software 1260 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. A storage controller for a storage system, comprising:
a host interface circuit, configured to receive host data for storage within the storage system;
a storage interface circuit, configured to transmit storage data to the storage system using a sequential write/random read traffic model;
wherein the storage controller has an emulation mode for processing data streams having host data characteristics and using a host command protocol, wherein the emulation mode enables the storage controller to emulate different media types for different partitions within the storage system; and
processing circuitry coupled with the host interface circuit and the storage interface circuit, configured to:
receive a request from a host, through the host interface circuit, for a partition within the storage system, the partition comprising one or more sequentially numbered data blocks;
receive partition parameters from the host, through the host interface circuit, the partition parameters corresponding to the host data characteristics, and comprising a size of the one or more sequentially numbered data blocks and an indication whether the partition is to be static, extendable, or linked;
configure, based at least in part on the partition parameters, the emulation mode to process the host data having host data characteristics and using the host command protocol into storage data having storage data characteristics different from the host data characteristics;
create the partition within the storage system, through the storage interface circuit, based on the partition parameters;
receive the host data having the host data characteristics and using the host command protocol from the host;
select the partition for storage of the host data based at least in part on the host data characteristics of the host data;
process, in the emulation mode, the host data into the storage data for storage within the partition, wherein the storage data has the storage data characteristics different from the host data characteristics and uses a storage command protocol different from the host command protocol; and
sequentially store the storage data in the one or more sequentially numbered data blocks in the partition, through the storage interface circuit.

2. The storage controller of claim 1, wherein the partition is extendable, and the processing circuitry is further configured to add storage to the partition from the storage system without erasing the storage data stored in the partition.

3. The storage controller of claim 1, wherein the processing circuitry is further configured to remove storage from the partition without erasing the storage data stored in the partition.

4. The storage controller of claim 1,
wherein the storage controller has an additional emulation mode for processing data streams having different host data characteristics and using a different host command protocol; and
wherein the processing circuitry is further configured to:
receive a request from the host, through the host interface circuit, for an additional partition within the storage system, the additional partition comprising one or more sequentially numbered data blocks, wherein the additional partition is a different size from the partition;
receive additional partition parameters from the host, through the host interface circuit, wherein the additional partition parameters correspond to the different host data characteristics, are different from the host partition parameters, and comprise a size of the one or more sequentially numbered data blocks and an indication whether the additional partition is to be static, extendable, or linked;
configure, based at least in part on the additional partition parameters, the additional emulation mode to process additional host data having different host data characteristics and using the different host command protocol into additional storage data having storage data characteristics different from the different host data characteristics;
create the additional partition within the storage system, through the storage interface circuit, based on the additional partition parameters;
receive additional host data having the different host data characteristics and using the different host command protocol from the host;
select the additional partition for storage of the additional host data based at least in part on the different host data characteristics of the additional host data;
process, in the additional emulation mode, the additional host data into the additional storage data for storage within the additional partition, wherein the additional storage data has the storage data characteristics different from the different host data characteristics and uses a storage command protocol different from the different host command protocol; and
sequentially store the additional storage data in the one or more sequentially numbered data blocks in the additional partition, through the storage interface circuit.

5. The storage controller of claim 4, wherein the partition comprises memory within the storage system having a first storage density, and the additional partition comprises memory within the storage system having a second storage density different from the first storage density.

6. The storage controller of claim 4, wherein the partition parameters and the additional partition parameters further comprise at least one parameter from the group of: storage density, physical memory attributes, protection attributes, security level, quality of service requirements, data type, data source, and data stream attributes.

7. The storage controller of claim 6, wherein the partition and the additional partition have the same data type, security level, and quality of service requirements, and the processing circuitry is further configured to link the additional partition to the partition.

8. A method of operating a storage controller, comprising:
receiving a request from a host, through a host interface circuit, for a first partition within a storage system, the first partition comprising one or more sequentially numbered data blocks, wherein the storage controller has an emulation mode for processing data streams having host data characteristics and using a host command protocol, wherein the emulation mode enables the storage controller to emulate different media types for different partitions within the storage system;
receiving partition parameters from the host, through the host interface circuit, the partition parameters corresponding to the host data characteristics, and comprising a size of the one or more sequentially numbered data blocks and an indication whether the partition is to be static, extendable, or linked;
configuring, based at least in part on the partition parameters, the emulation mode to process the host data having host data characteristics and using the host command protocol into storage data having storage data characteristics different from the host data characteristics;
creating the partition within the storage system, through a storage interface circuit, based on the partition parameters;
receiving host data having the host data characteristics and using the host command protocol from the host;
selecting the partition for storage of the host data based at least in part on the host data characteristics of the host data;
processing, in the emulation mode, the host data into the storage data for storage within the partition within the storage system using a sequential write/random read traffic model, wherein the storage data has the storage data characteristics different from the host data characteristics and uses a storage command protocol different from the host command protocol; and
sequentially storing the storage data in the one or more sequentially numbered data blocks in the partition, through the storage interface circuit.

9. The method of claim 8, wherein the partition is extendable, the method further comprising:
adding storage to the partition from the storage system without erasing the storage data stored in the partition.

10. The method of claim 8, further comprising:
removing storage from the partition without erasing the storage data stored in the partition.

11. The method of claim 8, wherein the storage controller has an additional emulation mode for processing data streams having different host data characteristics and using a different command protocol, and the method further comprising:
receiving a request from the host, through the host interface circuit, for an additional partition within the storage system, the additional partition comprising one or more sequentially numbered data blocks, wherein the additional partition is a different size from the partition;
receiving additional partition parameters from the host, through the host interface circuit, wherein the additional partition parameters correspond to the different host data characteristics, are different from the host partition parameters, and comprise a size of the one or more sequentially numbered data blocks and an indication whether the additional partition is to be static, extendable, or linked;
configuring, based at least in part on the additional partition parameters, the additional emulation mode to process additional host data having different host data characteristics and using the different host command protocol into additional storage data having storage data characteristics different from the different host data characteristics;
creating the additional partition within the storage system, through the storage interface circuit, based on the additional partition parameters;
receiving additional host data having the different host data characteristics and using the different host command protocol from the host;
selecting the additional partition for storage of the additional host data based at least in part on the different host data characteristics of the additional host data;
processing, in the additional emulation mode, the additional host data into the additional storage data for storage within the additional partition using a sequential write/random read traffic model, wherein the additional storage data has the storage data characteristics different from the different host data characteristics and uses a storage command protocol different from the different host command protocol; and
sequentially storing the additional storage data in the one or more sequentially numbered data blocks in the additional partition, through the storage interface circuit.

12. The method of claim 11, wherein the partition comprises memory within the storage system having a first storage density, and the additional partition comprises memory within the storage system having a second storage density different from the first storage density.

13. The method of claim 11, wherein the partition parameters and the additional partition parameters further comprise at least one parameter from the group of: storage density, physical memory attributes, protection attributes, security level, quality of service requirements, data type, data source, and data stream attributes.

14. The method of claim 13, wherein the partition and the additional partition have the same data type, security level, and quality of service requirements, the method further comprising:
linking the additional partition to the partition.

15. One or more non-transitory computer-readable media having stored thereon program instructions to operate a storage controller for a storage system, wherein the program instructions, when executed by processing circuitry, direct the processing circuitry to at least:
receive a request from a host, through a host interface circuit, for a partition within the storage system, the partition comprising one or more sequentially numbered data blocks, wherein the storage controller has an emulation mode for processing data streams having host data characteristics and using a host command protocol, wherein the emulation mode enables the storage controller to emulate different media types for different partitions within the storage system;
receive partition parameters from the host, through the host interface circuit, the partition parameters corresponding to the host data characteristics, and comprising a size of the one or more sequentially numbered data blocks and an indication whether the partition is to be static, extendable, or linked;
configure, based at least in part on the partition parameters, the emulation mode to process the host data having host data characteristics and using the host command protocol into storage data having storage data characteristics different from the host data characteristics;
create the partition within the storage system, through a storage interface circuit, based on the partition parameters;
receive host data having the host data characteristics and using the host command protocol from the host;
select the partition for storage of the host data based at least in part on the host data characteristics of the host data;
process, in the emulation mode, the host data into the storage data for storage within the partition using a sequential write/random read traffic model, wherein the storage data has the storage data characteristics different from the host data characteristics and uses a storage command protocol different from the host command protocol; and
sequentially store the storage data in the one or more sequentially numbered data blocks in the partition, through the storage interface circuit.

16. The one or more non-transitory computer-readable media of claim 15, wherein the partition is extendable, and the program instructions further direct the processing circuitry to at least:
add storage to the partition from the storage system without erasing the storage data stored in the partition.

17. The one or more non-transitory computer-readable media of claim 15, wherein the program instructions further direct the processing circuitry to at least:
remove storage from the partition without erasing the storage data stored in the partition.

18. The one or more non-transitory computer-readable media of claim 15, wherein the storage controller has a second emulation mode for processing data streams having different host data characteristics and using a different host command protocol, and wherein the program instructions further direct the processing circuitry to at least:
receive a request from the host, through the host interface circuit, for an additional partition within the storage system, the additional partition comprising one or more sequentially numbered data blocks, wherein the additional partition is a different size from the partition;
receive additional partition parameters from the host, through the host interface circuit, wherein the additional partition parameters correspond to the different host data characteristics, are different from the host partition parameters, and comprise a size of the one or more sequentially numbered data blocks and an indication whether the additional partition is to be static, extendable, or linked;
configure, based at least in part on the additional partition parameters, the additional emulation mode to process additional host data having different host data characteristics and using the different host command protocol into additional storage data having storage data characteristics different from the different host data characteristics;
create the additional partition within the storage system, through the storage interface circuit, based on the additional partition parameters;
receive additional host data having the different host data characteristics and using the different host command protocol from the host;

select the additional partition for storage of the additional host data based at least in part on the different host data characteristics of the additional host data;

process, in the additional emulation mode, the additional host data into the additional storage data for storage within the additional partition using a sequential write/ random read traffic model, wherein the additional storage data has the storage data characteristics different from the different host data characteristics and uses a storage command protocol different from the different host command protocol; and sequentially store the additional storage data in the one or more sequentially numbered data blocks in the additional partition, through the storage interface circuit.

19. The one or more non-transitory computer-readable media of claim 18, wherein the partition comprises memory within the storage system having a first storage density, and the additional partition comprises memory within the storage system having a second storage density different from the first storage density.

20. The one or more non-transitory computer-readable media of claim 18, wherein the partition parameters and the additional partition parameters further comprise at least one parameter from the group of: storage density, physical memory attributes, protection attributes, security level, quality of service requirements, data type, data source, and data stream attributes.

21. A method of operating a storage controller, comprising:

configuring an emulation mode to process host data having host data characteristics and using a host command protocol into storage data having storage data characteristics different from the host data characteristics, wherein the emulation mode enables the storage controller to emulate different media types for different partitions within the storage system;

receiving a write request transferred by a host using the host command protocol, the write request comprising the host data having the host data characteristics and directed to a storage media partition;

receiving partition parameters transferred by the host corresponding to the host data characteristics, comprising an indication whether the partition is to be static, extendable, or linked;

creating the storage media partition within corresponding storage media based on the partition parameters, wherein the configuring of the emulation mode is based at least in part on the partition parameters;

altering, in the emulation mode, a structural format of the host data into the storage data having the storage data characteristics different from the host data characteristics and using a storage command protocol different from the host command protocol; and storing the storage data in the storage media partition accordance with the storage data characteristics and the storage command protocol.

22. The method of claim 21, further comprising:

receiving a read request for host read data transferred by the host, using the host command protocol, the read request having the host data characteristics and directed to the storage media partition;

retrieving target data from the storage media partition, the target data stored in accordance with the storage data characteristics and the storage command protocol;

altering a structural format of the target data into host read data having the host data characteristics different from the storage data characteristics and using the host command protocol different from the storage command protocol; and transferring the host read data having the host data characteristics for delivery to the host system in accordance with the host command protocol.

* * * * *

UNITED STATES PATENT AND TRADEMARK OFFICE
CERTIFICATE OF CORRECTION

PATENT NO. : 10,754,587 B2  
APPLICATION NO. : 15/075184  
DATED : August 25, 2020  
INVENTOR(S) : Tod R. Earhart Page 1 of 1

It is certified that error appears in the above-identified patent and that said Letters Patent is hereby corrected as shown below:

In the Specification

Column 3, Line 30, delete "sing" and insert --(using--
Column 4, Line 48, delete "20." and insert --220.--
Column 4, Line 61, delete "IP." and insert --202.--
Column 5, Line 2, delete "performed," and insert --perform read,--
Column 5, Line 46, after "storage" insert --I/O--
Column 5, Line 46, delete "(3" and insert --(213--
Column 6, Line 28, delete "Igorithms" and insert --algorithms--
Column 7, Line 13, delete "visualization" and insert --virtualization--
Column 7, Line 32, delete "lame" and insert --large--
Column 7, Line 37, delete "SWIM" and insert --SWRR--
Column 8, Line 43, delete "ables" and insert --enables--
Column 8, Line 45, delete "voltages" and insert --volumes--
Column 9, Line 10, delete "posoibly wiihin" and insert --possibly within--
Column 10, Line 13, delete "create," and insert --creates--
Column 10, Line 54, after "can" insert --also--
Column 12, Line 2, delete "leaner" and insert --cleaner--
Column 12, Line 7, delete "ma" and insert --may--
Column 13, Line 61, delete "implemented" and insert --implement read--
Column 15, Line 10, delete "tile" and insert --file--
Column 15, Line 26, delete "further" and insert --farther--
Column 15, Line 39, delete "eMMIC," and insert --eMMC,--
Column 16, Line 24, delete "f" and insert --of--

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*